US009228254B2

(12) United States Patent
Yi et al.

(10) Patent No.: US 9,228,254 B2
(45) Date of Patent: Jan. 5, 2016

(54) CATHODE SPUTTERING GAS DISTRIBUTION APPARATUS

(75) Inventors: Chang Bok Yi, Fremont, CA (US); Tatsuru Tanaka, Campbell, CA (US)

(73) Assignee: Seagate Technology LLC, Cupertino, CA (US)

(*) Notice: Subject to any disclaimer, the term of this patent is extended or adjusted under 35 U.S.C. 154(b) by 1697 days.

(21) Appl. No.: 11/330,198

(22) Filed: Jan. 12, 2006

(65) Prior Publication Data

US 2007/0158186 A1    Jul. 12, 2007

(51) Int. Cl.
C23C 14/24 (2006.01)
C23C 14/34 (2006.01)
H01J 37/34 (2006.01)
C23C 14/00 (2006.01)

(52) U.S. Cl.
CPC ......... C23C 14/3407 (2013.01); C23C 14/0063 (2013.01); H01J 37/3411 (2013.01); H01J 37/3497 (2013.01)

(58) Field of Classification Search
USPC ............. 204/298.16, 298.26, 298.19, 298.07, 204/298.09
See application file for complete search history.

(56) References Cited

U.S. PATENT DOCUMENTS

| 4,894,133 | A | * | 1/1990 | Hedgcoth | 204/192.15 |
|---|---|---|---|---|---|
| 5,074,456 | A | * | 12/1991 | Degner et al. | 228/121 |
| 5,171,415 | A | * | 12/1992 | Miller et al. | 204/298.09 |
| 5,228,968 | A | * | 7/1993 | Zejda | 204/298.07 |
| 5,328,585 | A | * | 7/1994 | Stevenson et al. | 204/298.2 |
| 5,490,910 | A | * | 2/1996 | Nelson et al. | 204/192.15 |
| 5,683,537 | A | * | 11/1997 | Ishii | 156/345.33 |
| 5,781,693 | A | * | 7/1998 | Ballance et al. | 392/416 |
| 5,876,573 | A | * | 3/1999 | Moslehi et al. | 204/192.12 |
| 5,985,115 | A | * | 11/1999 | Hartsough et al. | 204/298.09 |
| 6,113,754 | A | * | 9/2000 | Oh et al. | 204/192.17 |
| 6,590,344 | B2 | | 7/2003 | Tao et al. | |
| 6,693,030 | B1 | | 2/2004 | Subrahmanyan et al. | |
| 6,830,664 | B2 | * | 12/2004 | Clarke | 204/192.12 |

* cited by examiner

Primary Examiner — Jason M Berman

(57) ABSTRACT

A cathode sputtering source comprises a heat sink comprising a substantially circularly-shaped planar disk formed of an electrically and thermally conductive material, with a circumferentially extending edge connecting first and second opposing major surfaces, the first major surface including a plurality of radially extending, recessed gas supply channels formed therein and extending from a central recess formed in the first major surface to the circumferentially extending edge; the second major surface including a gas inlet formed adjacent the circumferentially extending edge; a gas flow channel formed in the interior of the disk fluidly connects the gas inlet and central recess; and a substantially circular disk-shaped sputtering target is mounted on the first major surface, whereby gas supplied to the gas inlet is substantially uniformly distributed around the entirety of the circumferentially extending edge of the heat sink. Preferred embodiments include a rotatable magnetron magnet assembly positioned behind the heat sink.

12 Claims, 3 Drawing Sheets

CATHODE SPUTTERING GAS DISTRIBUTION APPARATUS

FIELD OF THE INVENTION

The present invention relates to an apparatus for injection of gas(es) into a vacuum chamber of a rotating magnetron sputtering apparatus for obtaining highly uniform composition sputter deposition of thin films over substantially the entire surface area(s) of a circularly-shaped substrate. The invention has particular utility in the manufacture of disk-shaped magnetic and magneto-optical data/information recording, storage, and retrieval media, wherein at least one constituent layer of the media is formed by a reactive sputter deposition process.

BACKGROUND OF THE INVENTION

Magnetic and MO recording media are widely employed in various applications, particularly in the computer industry for data/information recording, storage, and retrieval purposes. A magnetic medium in, e.g., disk form, such as utilized in computer-related applications, comprises a non-magnetic substrate, for example, of glass, ceramic, glass-ceramic composite, polymer, metal or metal alloy, typically an aluminum (Al)-based alloy such as aluminum-magnesium (Al—Mg), having at least one major surface on which a layer stack comprising a plurality of thin film layers constituting the medium are sequentially deposited. In the case of longitudinal type magnetic recording media, such layers may include, in sequence from the substrate deposition surface, a plating layer, e.g., of amorphous nickel-phosphorus (Ni—P), a polycrystalline underlayer, typically of chromium (Cr) or a Cr-based alloy such as chromium-vanadium (Cr—V), a longitudinally oriented magnetic layer, e.g., of a cobalt (Co)-based alloy, and a protective overcoat layer, typically of a carbon (C)-based material, such as diamond-like carbon (DLC), having good mechanical (i.e., tribological) and corrosion resistance properties. Perpendicular type magnetic recording media typically comprise, in sequence from the surface of a non-magnetic substrate, an underlayer of a magnetically soft material, at least one non-magnetic interlayer or intermediate layer, a vertically (i.e., perpendicularly) oriented recording layer of a magnetically hard material, and a protective overcoat layer.

A similar situation exists with magneto-optical (MO) media, wherein a layer stack is formed which comprises a reflective layer, typically of a metal or metal alloy, one or more rare-earth thermo-magnetic (RE-TM) alloy layers, one or more dielectric layers, and a protective overcoat layer, for functioning as reflective, transparent, writing, writing assist, and read-out layers, etc.

According to conventional manufacturing technology, a majority (if not all) of the above-described layers constituting stacked multi-layer longitudinal and perpendicular magnetic media, as well as MO recording media, are deposited by means of cathode sputtering processing. For example, the magnetic recording layers are typically fabricated by sputter depositing a Co-based alloy film, wherein the alloying elements are selected to promote desired magnetic and microstructural properties. In the case of longitudinal-type magnetic disk recording media, metallic and metalloidal elements, such as, for example, Cr, Pt, Ta, B, and combinations thereof, have been found to be effective. Similar alloying elements have been found to be useful in the case of perpendicular-type magnetic disk recording media, and in addition, reactive sputter deposition of the Co-based alloys in an oxygen ($O_2$)-containing atmosphere has been found to be especially effective in controlling (i.e., limiting) exchange coupling between adjacent magnetic grains.

In a typical reactive sputtering process utilized for formation of perpendicular-type magnetic recording media, $O_2$ gas is mixed with an inert sputtering gas, e.g., Ar, and is consumed by the depositing Co-based alloy magnetic film. Due to the high reactivity of $O_2$ with metals, and since only partial oxidation of the depositing Co-based alloy magnetic film is desired, the degree of oxidation as a function of the location or position on the substrate (i.e., disk) surface tends to exhibit wide variation depending upon the process conditions, including, inter alia, $O_2$ injection geometry, gas pumping (i.e., evacuation) geometry, gas flow rate, and film deposition rate.

FIG. 1 is a simplified, schematic, perspective view of a portion of an example of a one disk at-a-time sputtering apparatus 10 which may be utilized for sputter deposition of thin films as part of the manufacturing process of disk-shaped magnetic or MO recording media. As illustrated, apparatus 10 comprises: a vacuum chamber 1 equipped with an opening 2 at the bottom end thereof for connection to a pumping means for evacuating the interior of the chamber; at least one, preferably a pair of facing, circularly-shaped sputtering targets or sources 3A and 3B of conventional type, e.g., a pair of magnetron sputtering guns; a workpiece support or holder (not shown in the figure for illustrative clarity) for positioning a substrate/workpiece in the space between the pair of facing sputtering sources, illustratively a circular disk-shaped substrate 4 for a magnetic or MO recording medium, adapted for receipt of sputtered particle flux on the opposing surfaces thereof; and a gas injector 5 having a gas inlet portion 6 extending outside of chamber 1 for connection to a source of a process gas, and a gas outlet portion 7 within the chamber, for injecting the process gas, e.g., an inert gas such as Ar, Kr, etc., or a reactive gas such as $N_2$, $O_2$, etc., in the space between the facing pair of sputtering sources 3A and 3B. Illustratively, the gas injector 5 is "wishbone"-shaped, and comprises a linearly elongated, tubular inlet portion 6 having a first, gas inlet end, and a second end 7, with a pair of arcuately-shaped, tubular gas outlet portions 8A and 8B extending from the second end, comprising a plurality of spaced-apart, narrow diameter gas outlet orifices 9.

It has been determined that one-disk-at-a-time sputtering apparatus for the hard disk manufacturing industry, such as described above, employ gas injection systems with design criteria, e.g., geometries, which are poorly suited to the high film uniformity requirements of the hard disk industry, particularly with respect to the special problems presented by reactive sputtering in atmospheres containing $O_2$ for formation of granular magnetic recording layers. For example, as the oxide content of granular magnetic films increases, the exchange coupling between adjacent magnetic grains decreases, the hysteresis slope decreases, and S* (a measure of the oxygen content) decreases.

More specifically, in the case of "top-center" $O_2$/Ar injection, S* is highest at the bottom of the disks (i.e., at 180°), indicating that the bottom of the disks is oxide-poor, relative to the disk top and sides (i.e., 0, 90, and 270°). By contrast, in the case of "bottom-side" $O_2$/Ar injection, S* is lowest, i.e., the oxide content is highest, at the 90° position, corresponding to the region of the disk directly above the $O_2$/Ar injection port. However, variation, e.g., asymmetry, of the oxide content of the deposited magnetic films, as inferred from the values of the parameter S*, can be correlated with the $O_2$/Ar injection geometry of the sputtering apparatus. In general, the oxide content is highest in the region of the disk surface which is closest to the point of $O_2$/Ar injection. For the same sputtering chamber and pumping (evacuation) hardware, disks can be manufactured in which the magnetic recording layer is oxide rich at the top, bottom, or side(s), depending upon the geometry of the $O_2$/Ar injection system, suggesting that the variation in oxide content of the magnetic recording layer (as reflected in the value of S*) can be reduced by proper design of the injection geometry/system.

FIG. 2 is a simplified, schematic, view of a portion (i.e., a center sectional view) of another example of a one at-a-time sputtering apparatus 20 which may be utilized for sputter deposition of thin films as part of the manufacturing process of disk-shaped magnetic and MO recording media. As illustrated, sputtering apparatus 20 comprises a vacuum chamber 11 equipped with a vertically movable workpiece/substrate mount or holder 12 for positioning a circular disk-shaped media substrate 4 in spaced opposition to a circularly-shaped sputtering target or source 13 of conventional type, e.g., a magnetron sputtering gun, for receipt of sputtered particle flux on a first, facing surface thereof. Chamber 11 typically includes another, similarly configured, circularly-shaped sputtering target or source (not shown in FIG. 2) positioned in spaced opposition to a second, opposing surface of substrate 4 for sputter deposition thereon. As shown in the figure, chamber 11 is provided with a pair of channels 13A and 13B which extend through the chamber base 12 at opposite ends thereof for supplying process gas(es) to the interior space of the chamber. Each of the channels 13A and 13B includes a respective branch portion 14A and 14B terminating at gas injection ports or orifices 15A and 15B formed in respective interior wall portions 16A and 16B of chamber 11 for supplying process gas to the lower portion of the chamber, as well as respective elongated, upwardly extending branches 17A and 17B respectively terminating in side gas injection ports or orifices 18A and 18B and top gas injection ports or orifices 19A and 19B for supplying process gas(es) to the side and upper portions of chamber 11. The process gas(es) supplied to the interior of chamber 11 is (are) evacuated via outlets at the lower portion of the chamber (not shown in the figure for illustrative simplicity).

According to this arrangement, control of the process gas pressure distribution within chamber 11 is possible only by closing or opening selected ones of gas injection ports or orifices 13A, 13B, 18A, 18B, 19A, and 19B. For example, if the bottom and side gas injection ports or orifices 13A, 13B, 18A, and 18B are closed (e.g., plugged), the process gas is injected only via the top gas injection ports or orifices 19A and 19B. Disadvantageously, however, irrespective of which gas injection port or orifice, or combination of gas injection ports or orifices, is utilized, a gas pressure gradient will exist from the top to the bottom of chamber 11, and in addition, a difference in gas pressure across the sides of substrate 4 will be established if the pumping path for gas evacuation is not symmetrical.

The top-to-bottom process gas pressure gradient which is established as described above typically has an adverse affect on the properties of the sputter deposited thin films. More specifically, the top-to-bottom gas pressure gradient results in circumferentially non-uniform magnetic properties of the various magnetic layers, including soft underlayers and longitudinal and perpendicular recording layers. The effect of circumferential non-uniformity of the sputter deposition process is particularly observed when the films are formed by a reactive sputtering process, as in the formation of granular magnetic films.

Another apparatus for performing cathode sputter deposition of thin films on circular disk-shaped substrates with circumferential uniformity comprises a circularly-shaped planar magnetron sputtering source with a rotating magnet assembly provided adjacent the back side surface of the sputtering target for increasing uniformity of sputtering therefrom and increasing target lifetime. The sputtering source comprises a circular disk-shaped cathode/target with a planar sputtering surface provided with a ring-shaped gas channel extending around the circumference thereof, with the front facing side or surface of the gas channel provided with a plurality of substantially equally spaced small gas injection holes or orifices (e.g., of 0.025" diameter) for uniform injection of process gas into the sputtering chamber between the target and the disk-shaped substrate. The gas channel is provided with gas from a source via a relatively larger gas inlet opening formed on the rearward facing surface thereof.

According to the design principle of this apparatus, the injection holes or orifices of the gas channel must be sufficiently small in order to ensure an even gas distribution around the target. In general, the smaller the holes or orifices, the better the gas distribution. However, if the holes or orifices are too large, the process gas(es) enter the sputtering chamber via the holes or orifices nearer the gas inlet. Nonetheless, other issues are generated when the holes or orifices are too small. For example, when the holes or orifices are too small, an excessively long interval is required for pressurizing the sputtering chamber, thereby reducing the product throughput. In addition, the interval required for evacuating process gas (es) from the chamber is disadvantageously lengthened, the effect of slow pump-out being heightened when reactive gases, such as $O_2$, must be removed from the chamber, for example, in order not to contaminate neighboring chambers of a multi-chamber sputtering apparatus utilized for automated manufacture of magnetic and MO recording media.

A sputter deposition apparatus has previously been disclosed with a gas supply system adapted for providing the process (i.e., vacuum) chamber of the apparatus with a uniform flow of at least one process gas around the entirety of a circumferentially extending edge of a cathode sputtering source in the form of a circularly-shaped planar magnetron sputtering target assembly with a fixed (i.e., static) magnetron magnet assembly, wherein the gas supply system comprises a gas inlet conduit adapted for introducing the at least one process gas into a space formed between a rear side of the sputtering target assembly and a mounting plate for mounting the sputtering source to a wall of the process chamber. The gas supply system further comprises a gap formed between the circumferentially extending edge of the sputtering target assembly and a cathode dark space shield surrounding the edge, the space and the gap being in fluid communication.

However, in the case of circularly-shaped planar magnetron target assemblies comprising rotating magnetron magnet assemblies for enhanced uniformity of sputtered particle distribution and target erosion (hence increased lifetime), the aforementioned gap (between a heat sink of the target and the magnet assembly) is extremely small, rendering back-side process gas injection (as described above) difficult or impractical. More specifically, while the spacing between the heat sink and the magnet assembly is adjustable in some available models of rotating magnetron target assemblies, the magnet assemblies must be positioned very closely to the target (or its heat sink) in order to strike a satisfactory sputtering plasma with low pass-through flux ("PTF") target materials, such as utilized for depositing magnetic recording layers and magnetically soft underlayers ("SUL"s).

In view of the foregoing, there exists a clear need for improved means and methodology for depositing thin films by sputtering techniques (e.g., reactive sputtering) utilizing magnetron sputtering sources with rotating magnets and at deposition rates consistent with the throughput requirements of automated manufacturing processing, which have a specified, typically minimal, variation of composition and/or properties over the substrate surface. More specifically, there exists a need for improved means and methodology for overcoming the above-described drawbacks and disadvantages associated with rotating magnet sputter deposition processing for the manufacture of hard disk magnetic and MO recording media, notably reactive sputtering involving oxide content variation over the disk surface which exceeds specified manufacturing tolerances.

The present invention addresses and solves the problems, disadvantages, and drawbacks described supra in connection with conventional means and methodology for performing sputter deposition of thin films, particularly reactive sputtering of oxide-containing perpendicular magnetic recording layers, while maintaining full compatibility with all aspects of conventional automated manufacturing technology for hard disk magnetic and MO recording media. Further, the means and methodology afforded by the present invention enjoy diverse utility in the manufacture of all manner of devices and products requiring formation of high compositional uniformity thin films by means of reactive sputtering processing.

DISCLOSURE OF THE INVENTION

An advantage of the present invention is an improved heat sink for a sputtering source.

Another advantage of the present invention is an improved sputtering source.

Yet another advantage of the present invention is an improved sputtering apparatus.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by an improved heat sink for a cathode sputtering source, comprising a substantially circularly-shaped planar disk formed of an electrically and thermally conductive material, the disk having a circumferentially extending edge connecting first and second opposing major surfaces, wherein:

(a) the first major surface includes a plurality of radially extending, recessed gas supply channels formed therein, each of said channels extending from a central recess formed in the first major surface to the circumferentially extending edge;

(b) the second major surface includes a gas inlet adjacent the circumferentially extending edge; and (c) a gas flow channel formed in the interior of the disk fluidly connects the gas inlet and the central recess.

In accordance with preferred embodiments of the present invention, the plurality of radially extending gas supply channels define a plurality of pie-shaped segments of equal size in the first major surface; each of the pie-shaped segments includes a pair of openings extending between the first and second major surfaces adjacent the circumferentially extending edge, a first one of the openings adapted for fastening a target mounting ring to the first major surface and a second one of the openings adapted for fastening the second major surface to a magnet assembly housing; the second major surface includes a coolant inlet and a coolant outlet adjacent the circumferentially extending edge; and (d) a coolant flow channel formed in the interior of the disk fluidly connects the coolant inlet and outlet.

Another aspect of the present invention is an improved cathode sputtering source, comprising:

(a) a heat sink comprising a substantially circularly-shaped planar disk formed of an electrically and thermally conductive material, the disk having a circumferentially extending edge connecting first and second opposing major surfaces, wherein:

(i) the first major surface includes a plurality of radially extending, recessed gas supply channels formed therein, each of the channels extending from a central recess formed in the first major surface to the circumferentially extending edge;

(ii) the second major surface includes a gas inlet formed adjacent the circumferentially extending edge; and (iii) a gas flow channel formed in the interior of the disk fluidly connects the gas inlet and said central recess; and (b) a substantially circular disk-shaped sputtering target mounted on the first major surface of the heat sink, whereby gas supplied to the gas inlet is substantially uniformly distributed around the entirety of the circumferentially extending edge of the heat sink.

Preferably, the plurality of radially extending gas supply channels define a plurality of pie-shaped segments of equal size in the first major surface of the heat sink; each of the pie-shaped segments includes a pair of openings extending between the first and second major surfaces of the heat sink adjacent the circumferentially extending edge, a first one of said openings adapted for mounting the target to the first major surface via a target mounting ring and a second one of the openings adapted for fastening the second major surface to a magnet assembly housing; and (iv) the second major surface of the heat sink includes a coolant inlet and a coolant outlet adjacent the circumferentially extending edge, the coolant inlet and outlet fluidly connected via a coolant flow channel formed in the interior of the disk.

According to further embodiments of the present invention, the sputtering source further comprises a magnet assembly adjacent the second major surface of the heat sink, preferably a planar magnetron magnet assembly, and more preferably, a planar magnetron magnet assembly which is rotatable about a central axis.

In accordance with embodiments of the present invention, the sputter source further comprises a housing surrounding the magnet assembly, and an electrically insulated gas feed conduit extending through the housing and in fluid communication with the gas inlet of the second major surface of the heat sink.

A further aspect of the present invention is an improved cathode sputtering apparatus, comprising:

(a) a vacuum chamber;

(b) a first cathode sputtering source in the chamber, comprising a heat sink comprising a substantially circularly-shaped planar disk formed of an electrically and thermally conductive material, the disk having a circumferentially extending edge connecting first and second opposing major surfaces, wherein:

(i) the first major surface includes a plurality of radially extending, recessed gas supply channels formed therein, each of the channels extending from a central recess formed in the first major surface to the circumferentially extending edge;

(ii) the second major surface includes a gas inlet formed adjacent the circumferentially extending edge;

(iii) a gas flow channel formed in the interior of the disk fluidly connects the gas inlet and the central recess; and (iv) a substantially circular disk-shaped sputtering target is mounted on the first major surface of the heat sink; and (c) a workpiece holder in the chamber, adapted for positioning a first, planar surface of a circular disk-shaped substrate in spaced opposition to the sputtering target for receipt of sputtered particle flux therefrom;

whereby process gas(es) supplied to the gas inlet is (are) substantially uniformly distributed around the entirety of the circumferentially extending edge of the heat sink for sputter depositing a substantially circumferentially uniform thin film on the first surface of the substrate.

According to preferred embodiments of the present invention, the apparatus further comprises:

(d) a second cathode sputtering source in the chamber, the second cathode sputtering source being substantially identical to the first cathode sputtering source and positioned for sputter depositing a thin film on a second, planar surface of the circular disk-shaped substrate.

Preferably, the plurality of radially extending gas supply channels define a plurality of pie-shaped segments of equal size in the first major surface of the heat sink of each of the first and second sputtering sources; each of the pie-shaped segments includes a pair of openings extending between the first and second major surfaces of each heat sink adjacent its circumferentially extending edge, a first one of the openings is adapted for mounting a respective target to a first major surface via a target mounting ring and a second one of the openings is adapted for fastening the second major surface to a respective magnet assembly housing.

According to preferred embodiments of the present invention, the second major surface of each heat sink includes a coolant inlet and a coolant outlet adjacent the circumferentially extending edge, the coolant inlet and outlet fluidly connected via a coolant flow channel formed in the interior of each disk; and each sputtering source further comprises a magnet assembly adjacent the second major surface of each heat sink. Preferably, each magnet assembly is a planar magnetron magnet assembly, more preferably a planar magnetron magnet assembly rotatable about a central axis.

In accordance with embodiments of the present invention, the sputtering apparatus further comprises:

(e) a housing surrounding the magnet assembly; and (f) an electrically insulated gas feed conduit extending through the housing and in fluid communication with the gas inlet of said second major surface of the heat sink.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the same reference numerals are employed throughout for designating like features and wherein the various features are not necessarily drawn to scale but rather are drawn as to best illustrate the pertinent features, wherein.

DESCRIPTION OF THE INVENTION

As previously indicated, the present invention addresses and solves problems, disadvantages, and drawbacks described supra, i.e., poor circumferential uniformity of film composition and magnetic performance properties, such as are encountered when thin films for disk-shaped magnetic and MO recording media are formed by sputter deposition techniques and methodologies, particularly reactive sputtering of oxide-containing perpendicular magnetic recording layers, while maintaining full compatibility with all aspects of conventional automated manufacturing technology for hard disk magnetic and MO recording media. Advantageously, the means and methodology afforded by the present invention enjoy diverse utility in the manufacture of all manner of devices and products requiring formation of high compositional uniformity thin films by means of sputter deposition.

The present invention is based upon recognition that substantial improvement in circumferential uniformity of sputter-deposited thin films, including reactively sputtered thin films such as granular magnetic recording layers, can be obtained with one-at-time sputtering apparatus including at least one opposing circular sputtering target assembly—circular substrate arrangement, by introducing the sputter process gas(es) to the deposition chamber via the backside and around the circumferential edge of the at least one circularly-shaped target, such that a uniform flow of the process gas(es) occurs around the entire circumferentially extending edge of the at least one sputtering target assembly. In addition, the means and methodology of the present invention overcome the above-described drawbacks and disadvantages associated with planar magnetron sputter deposition sources including a rotating magnet assembly for increased uniformity of sputtered particle flux and target erosion.

Figure 1:
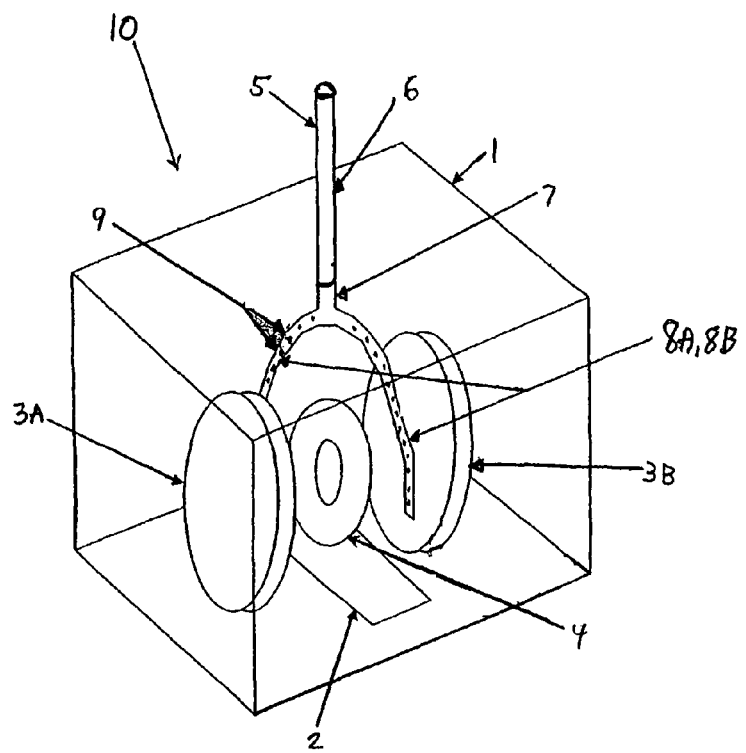
FIG. 1 is a simplified perspective view of a portion of one example of a one disk at-a-time sputtering apparatus which may be utilized for sputter deposition of thin films as part of the manufacturing process of disk-shaped magnetic or MO recording media.
Figure 2:
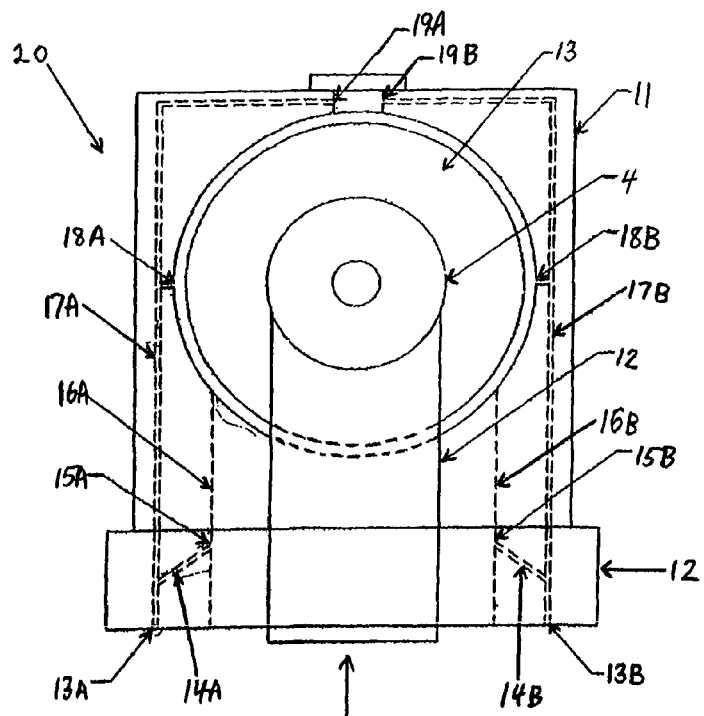
FIG. 2 is a simplified schematic view (i.e., a center sectional view) of a portion of another example of a one at-a-time sputtering apparatus which may be utilized for sputter deposition of thin films as part of the manufacturing process of disk-shaped magnetic and MO recording media.
Figure 3A:
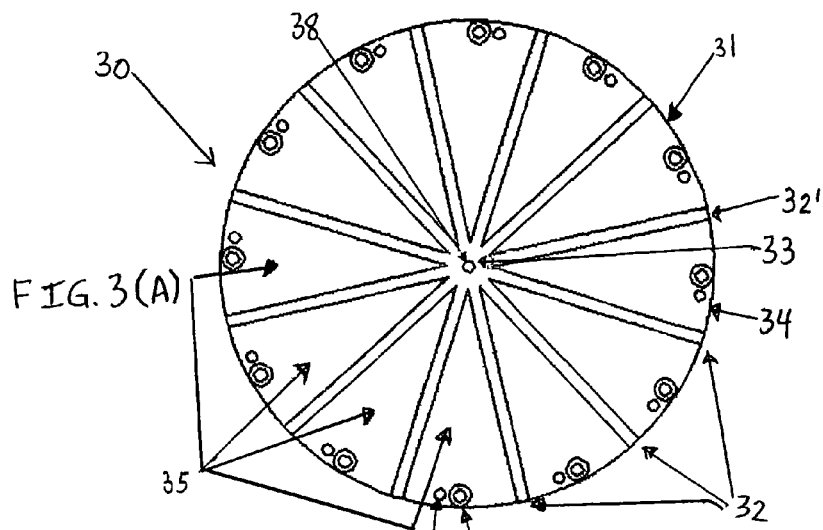
FIGS. 3(A), 3(B), and 3(C), respectively, are simplified, schematic front, rear, and interior sectional views of a heat sink according to an illustrative, but not limitative, embodiment of the present invention.
Figure 3B:
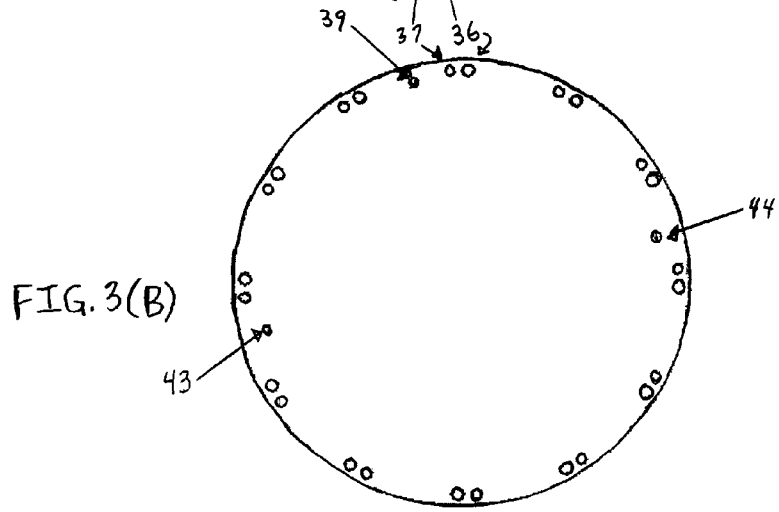
Figure 3C:
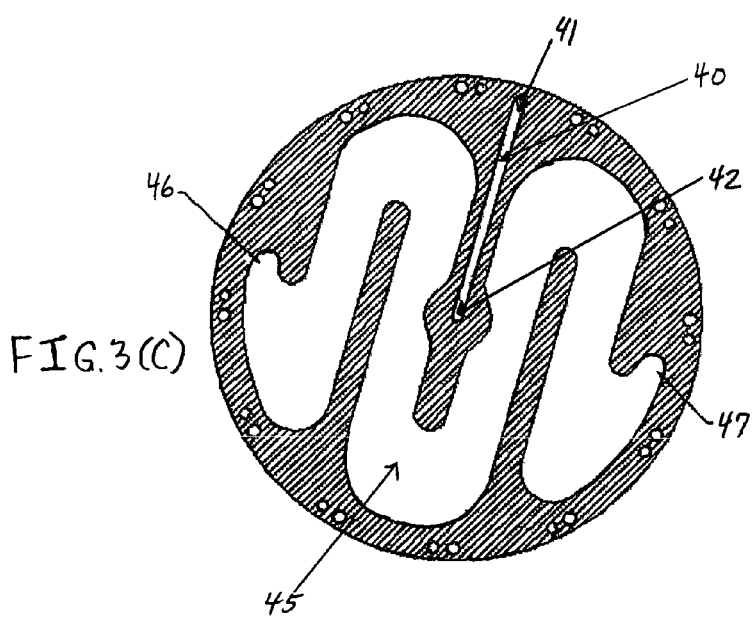

Referring to FIGS. 3(A), 3(B), and 3(C), respectively, shown therein are simplified, schematic front, rear, and sectional views of a heat sink 30 for a circularly-shaped sputtering source according to an illustrative, but non-limitative, embodiment of the present invention. Heat sink 30 comprises a substantially circular-shaped disk 31 formed of an electrically and thermally conductive material, e.g., a metal or a metal alloy such as aluminum or an aluminum-based alloy, and is sufficiently thick for providing sufficient mechanical rigidity and robustness but thin enough to maintain a minimum separation between the target and magnetron magnet assembly for maintaining a stable plasma ignition with low PTF target materials, e.g., materials utilized for deposition of magnetic recording layers and magnetically soft underlayers. Illustratively, a useful thickness is approximately 0.25".

As shown in FIG. 3(A), the front surface of disk 31 is provided with a patterned plurality of recessed gas supply channels 32, each of which extends radially from a central recess 33 to the circumferential edge 34 of the disk, dividing the front surface of disk 31 into a plurality (illustratively 12) of substantially equally sized, pie-shaped segments 35. Each of the pie-shaped segments 35 is provided with a pair of mounting holes 36, 37 at the arcuate end thereof for use in mounting a sputtering target to the front surface of disk 31 and for mounting disk 31 to a housing of the sputtering source, e.g., a housing of a magnetron magnet assembly. A recessed opening 38 is located within central recess 33 for supplying process gas(es) to the plurality of gas supply channels 32. Each of the gas supply channels 32 is of sufficient width for providing adequate gas pumping conductance, but small enough to avoid plasma ignition within the channels. In this regard, it is noted that a combination of a large width (i.e., >~3 mm), high cathode voltage, and high gas pressure can disadvantageously establish a hollow cathode discharge within the gas supply channels which can eventually result in penetration of the heat sink. An illustrative, but non-limitative, example of a suitable design for gas supply channels 32 features a width of about 0.150" and a depth of about 0.025". By way of comparison, an existing design for a ring-shaped gas channel, such as described supra, comprises very small diameter gas outlet holes or orifices, e.g., ~0.025", which disadvantageously restrict gas pumping conductance.

Adverting to FIGS. 3(B) and 3(C), the rear surface of disk 31 includes opening 39 adjacent the circumference thereof in fluid communication with a first end 41 of internally formed gas supply channel 40. Second end 42 of internal gas supply cannel 40 is in vertical registry and fluid communication with recessed opening 38 located within central recess 33 on the front surface of disk 31, thereby establishing a path for supply of process gas(es) to gas supply channels 32 via the rear surface of disk 31.

Still referring to FIGS. 3(B) and 3(C), the rear surface of disk 31 further includes a first opening 43 adjacent the circumference thereof and serving as an inlet for supply of a fluid coolant, e.g., water, and a second opening 44 adjacent the circumference at a location diametrically opposite the first opening 43 and serving as an outlet for withdrawal of the coolant. The first opening 43 is in vertical registry and fluid communication with a first, inlet end 46 of tortuous internal coolant channel 45 and second opening 44 is in vertical registry and fluid communication with a second, outlet end 46 of coolant channel 45.

The heat sink 30 according to the illustrated embodiment may be conveniently fabricated by laminating first, second, and third portions respectively corresponding to the front, interior, and rear views schematically shown in FIGS. 3(A), 3(C), and 3(B). Alternatively, heat sink 31 may be formed by machining, casting, or molding.

According to the invention, when a planar disk-shaped sputtering target is secured to the front surface of heat sink 30 (e.g., via openings 37), and process gas(es) is (are) supplied to the central recess 33 via the fluid path established between the gas inlet opening 39 on the rear surface of disk 31, the internal gas channel 41, and the recessed opening 38 located within central recess 33 on the front surface of disk 31, the process gas(es) are uniformly injected into the process chamber around the circumference of the sputtering source via the open ends 32' of the pattern of radially extending gas supply channels 32. A circumferentially uniform process gas distribution is thus established, leading to deposition of substantially circumferentially uniform thin films on a circular disk-shaped substrate positioned in the process chamber in spaced opposition to the sputtering source. Upon completion of the sputtering process, the supply of process gas(es) to the chamber is terminated and the gas(es) evacuated therefrom via a vacuum pump. The radial pattern of gas supply channels advantageously facilitates rapid pump-out of the chamber by providing high pumping conductance to levels in the $10^{-4}$ Torr range or lower. As before, a pair of substantially identically configured sputtering sources comprising the heat sink/process gas distribution system according to the invention may be provided for simultaneous sputter deposition on opposing surfaces of a disk-shaped substrate, e.g., for a magnetic or MO recording medium.

Figure 4:
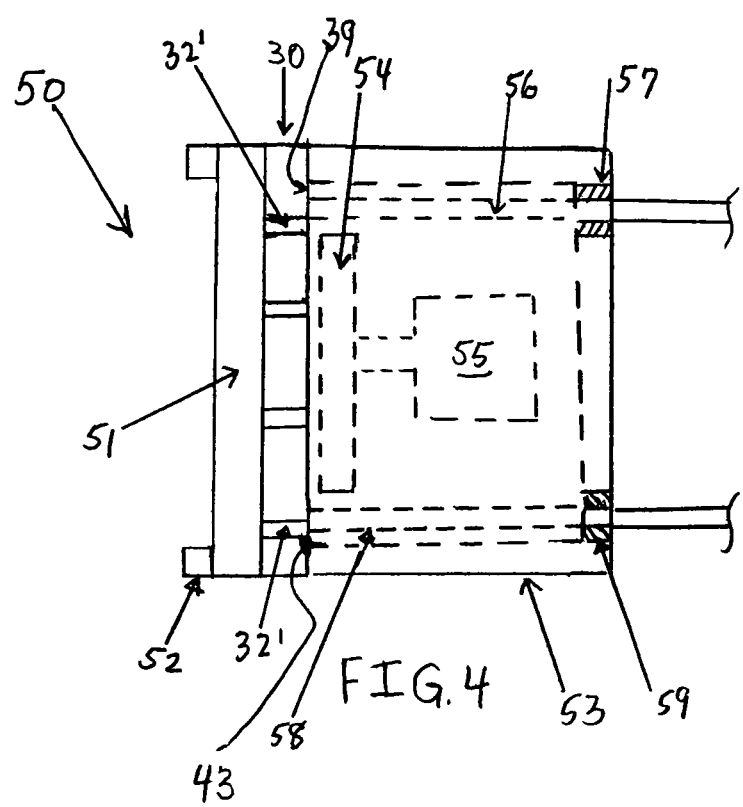
FIG. 4 is a simplified, schematic side view of a rotating magnetron sputtering source comprising a heat sink according to an embodiment of the present invention.

Referring to FIG. 4, shown therein is a simplified, schematic side view of a rotating magnetron sputtering source 50 comprising a heat sink 30 according to the above-described embodiment of the present invention. As illustrated, rotating magnetron sputtering source 50 includes a circular disk-shaped sputtering target/cathode 51 mounted to the front surface of heat sink 31 via target mounting/clamping ring 52. Openings 32' at the circumferential ends of the gas supply channels 32 provide a substantially uniform distribution of process gas(es) around the circumference of the sputtering source 50, as described above.

Housing 53 containing magnetron magnet assembly 54 which is rotatable about a central axis via motor 55 is mounted (in electrically insulated manner) to the rear surface of heat sink 31 with a very small gap between the magnet assembly 54 and the rear surface 31 in order to avoid the aforementioned problems associated with low PTF magnetic target materials. Process gas supply conduit 56 is routed to the gas inlet opening 39 at the circumferential edge of the rear surface of the heat sink 31 so as not to interfere with the rotating magnet assembly 54. Inasmuch as the heat sink 31 is energized at a high voltage (e.g., ~1,500 VDC) during operation, conduit 56 is electrically isolated from housing 53 via electrical insulator sleeve 57. A similarly functioning electrical insulator sleeve 59 is provided for coolant supply conduit 58 fluidly connected to coolant inlet 43 at the circumferential edge of the rear surface of the heat sink 31 (a coolant withdrawal conduit fluidly connected to coolant outlet 44 at the circumferential edge of the rear surface of the heat sink 31 is not shown in the figure for illustrative simplicity).

The present invention thus provides a number of advantages over conventional apparatus and methodology for sputtering, e.g., reactive sputtering, including improved compositional uniformity over 360° of a substrate surface, such as a magnetic disk substrate. Further, utilization of the inventive apparatus and methodology as part of conventional manufacturing apparatus and methodology for hard disk recording media can be readily implemented, in view of the full compatibility of the invention with all other aspects of automated media manufacture. Finally, the inventive apparatus and methodology are broadly applicable to reactive sputtering processing utilized for the manufacture of a variety of different products, e.g., coated architectural glass and multi-layer optical coatings.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail, in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. A heat sink comprising:
   a first surface comprising a plurality of channels operable to supply gas to a sputtering target;
   a second surface comprising a gas inlet channel extending radially from a gas inlet adjacent to a circumferential edge of said second surface to a center of said second surface, wherein said gas inlet channel is operable to supply said gas from said gas inlet toward said center and to said plurality of channels; and
   a coolant channel operable to circulate coolant material therein, wherein said coolant channel is disposed between said first surface and said second surface.

2. The heat sink as described in claim 1, wherein said first surface is substantially circular, and wherein said plurality of channels extends radially from a center to an outer edge of said first surface, and wherein further said plurality of channels divides said first surface into substantially equal sized portions.

3. The heat sink as described in claim 1 further comprising:
   a first opening on said first surface, wherein said first opening on said first surface is operable to couple a target mounting apparatus to said first surface; and
   a second opening on said second surface, wherein said second opening is operable to be coupled to a housing of a sputtering source.

4. The heat sink as described in claim 1, wherein said second surface further comprises:
   an inlet for said coolant channel operable to allow input of coolant to said coolant channel; and
   a coolant outlet for said coolant channel operable to allow removal of said coolant therefrom, wherein said inlet and said coolant outlet are disposed substantially on opposite ends of said second surface.

5. A cathode sputtering source, comprising:
   a heat sink comprising:
      a first surface comprising a plurality of channels operable to supply gas to a sputtering target;
      a second surface comprising a gas inlet channel extending radially from a gas inlet adjacent to a circumferential edge of said second surface to a center of said second surface, wherein said gas inlet channel is formed internally within said second surface and is operable to supply said gas from said gas inlet toward said center and to said plurality of channels; and
      a coolant channel operable to circulate coolant material therein, wherein said coolant channel is disposed between said first surface and said second surface; and
   a sputtering target receiver operable to receive a sputtering target, wherein said sputtering target receiver is also operable to mount said sputtering target on said first surface, and wherein said heat sink is operable to uniformly provide said gas to said sputtering target.

6. The cathode sputtering source as described in claim 5, wherein said first surface is substantially circular, and wherein said plurality of channels extends radially from a center to an outer edge of said first surface, and wherein further said plurality of channels divides said first surface to substantially equal sized portions.

7. The cathode sputtering source as described in claim 5 further comprising:
   a first opening on said first surface, wherein said first opening on said first surface is operable to couple said sputtering target receiver with said first surface; and
   a second opening on said second surface, wherein said second opening is operable to couple said heat sink to a housing of a sputtering source.

8. The cathode sputtering source as described in claim 5, wherein said second surface further comprises:
   an inlet for said coolant channel operable to allow input of coolant to said coolant channel; and
   a coolant outlet for said coolant channel operable to allow removal of said coolant there from, wherein said inlet and said coolant outlet are disposed substantially on opposite ends of said second surface.

9. The cathode sputtering source as described in claim 5 further comprising:
   a magnet assembly disposed adjacent to said second surface.

10. The cathode sputtering source as described in claim 9, wherein said magnet assembly comprises a planar magnetron magnet assembly, and wherein said magnet assembly is operable to rotate about its central axis.

11. The cathode sputtering source as described in claim 5, wherein said sputtering target receiver comprises a clamping ring.

12. The cathode sputtering source as described in claim 9 further comprising:
   a housing surrounding said magnet assembly;
   a gas supply conduit electrically insulated from said housing, and operable to provide said gas to said plurality of channels; and
   a coolant conduit electrically insulated from said housing, and operable to provide said coolant material to said coolant channel.

* * * * *